US012007800B2

(12) United States Patent
Chang (10) Patent No.: US 12,007,800 B2
(45) Date of Patent: Jun. 11, 2024

(54) POWER VOLTAGE SUPPLY DEVICE WITH AUTOMATIC TEMPERATURE COMPENSATION (71) Applicant: NANYA TECHNOLOGY CORPORATION, New Taipei (TW)

(72) Inventor: Chih-Hang Chang, Hsinchu (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 197 days.

(21) Appl. No.: 17/866,539

(22) Filed: Jul. 17, 2022

(65) Prior Publication Data

US 2024/0019884 A1    Jan. 18, 2024

(51) Int. Cl.
G11C 11/4074 (2006.01)
G05F 1/46 (2006.01)
G05F 1/567 (2006.01)

(52) U.S. Cl.
CPC .............. G05F 1/567 (2013.01); G05F 1/461 (2013.01); G11C 11/4074 (2013.01)

(58) Field of Classification Search
CPC ...... G05F 1/567; G05F 1/461; G11C 11/4074
USPC ...................................................... 365/226
See application file for complete search history.

(56) References Cited

U.S. PATENT DOCUMENTS

| 4,879,505 A | 11/1989 | Barrow et al. |
| 7,911,261 B1 * | 3/2011 | Shamarao ................. G05F 3/08 |
| | | 327/535 |
| 9,389,624 B2 | 7/2016 | Handford et al. |
| 2015/0138870 A1 * | 5/2015 | Joo ......................... G11C 17/18 |
| | | 365/104 |

FOREIGN PATENT DOCUMENTS

| CN | 107045370 | 12/2018 |
| TW | I303829 | 12/2008 |
| TW | I663496 | 6/2019 |
| TW | 202121428 | 6/2021 |

OTHER PUBLICATIONS

"Office Action of Taiwan Counterpart Application", issued on Jun. 8, 2023, p. 1-p. 5.

* cited by examiner

Primary Examiner — Huan Hoang
(74) Attorney, Agent, or Firm — JCIPRNET (57) ABSTRACT A power voltage supply device, including a reference bias voltage generating circuit, a temperature compensation bias voltage generating circuit, a compensation voltage generator, and a voltage buffer, is provided. The reference bias voltage generating circuit generates a reference bias voltage. The temperature compensation bias voltage generating circuit generates a temperature compensation bias voltage that changes as temperature rises. The compensation voltage generator generates a first power voltage based on the reference bias voltage, and selectively boosts the first power voltage based on the temperature compensation bias voltage. An input terminal of the voltage buffer receives the first power voltage. The voltage buffer generates a second power voltage corresponding to the first power voltage to a load circuit.

15 Claims, 4 Drawing Sheets

POWER VOLTAGE SUPPLY DEVICE WITH AUTOMATIC TEMPERATURE COMPENSATION

BACKGROUND

Technical Field

The disclosure relates to an electronic circuit, and in particular to a power voltage supply device with automatic temperature compensation.

Description of Related Art

The transmission capability of many functional circuits (load circuits) is related to the power voltage of the functional circuit. For example, a receiver in a dynamic random access memory (DRAM) is responsible for data reception, and the receiving capability of the receiver is related to the power voltage of the receiver. When the power voltage is larger, the receiving capability of the receiver is better (and vice versa). A transmitter (responsible for data transmission) in the DRAM also has similar characteristics. When the power voltage is larger, the transmission capability of the transmitter is better. In general, the power voltage of the functional circuit is a fixed voltage.

At high temperature, electrons in a semiconductor are heated and excited, causing the electrons to move randomly and generate thermal noise, which in turn degrades the transmission capability of the functional circuit (the load circuit). For example, high temperature may degrade the transmission capability of the receiver and the transmitter in the DRAM, causing an increased bit error rate, resulting in data loss. In severe cases, the receiver and transmitter are forced to slow down to reduce the bit error rate, so as to reduce data loss. The slowdown of the receiver and the transmitter also means that the DRAM needs to operate at a reduced frequency. How to maintain the transmission capability of the functional circuit (the load circuit) as much as possible without changing the transmission speed (operating frequency) is one of many technical issues.

SUMMARY

The disclosure provides a power voltage supply device, which can selectively boost a power voltage of a load circuit as temperature rises.

In an embodiment of the disclosure, the power voltage supply device includes a reference bias voltage generating circuit, a temperature compensation bias voltage generating circuit, a compensation voltage generator, and a voltage buffer. The reference bias voltage generating circuit is configured to generate a reference bias voltage. The temperature compensation bias voltage generating circuit is configured to generate a temperature compensation bias voltage. The temperature compensation bias voltage changes as temperature rises. The compensation voltage generator is coupled to the reference bias voltage generating circuit and the temperature compensation bias voltage generating circuit to receive the reference bias voltage and the temperature compensation bias voltage. The compensation voltage generator is configured to generate a first power voltage based on the reference bias voltage, and selectively boost the first power voltage based on the temperature compensation bias voltage. An input terminal of the voltage buffer is coupled to the compensation voltage generator to receive the first power voltage. The voltage buffer is configured to generate a second power voltage corresponding to the first power voltage to a load circuit.

Based on the above, the power voltage supply device according to the embodiment of the disclosure may generate the reference bias voltage that ideally does not change with temperature, and may generate the temperature compensation bias voltage that changes as temperature rises. The power voltage supply device may generate the power voltage suitable for the load circuit based on the reference bias voltage. Based on the temperature compensation bias voltage, the power voltage supply device may selectively boost the power voltage of the load circuit as temperature rises. Therefore, the power voltage supply can maintain the transmission capability of the load circuit (the functional circuit) as much as possible at high temperature.

In order for the features and advantages of the disclosure to be more comprehensible, the following specific embodiments are described in detail in conjunction with the drawings.

DESCRIPTION OF THE EMBODIMENTS

The term "coupling (or connection)" as used throughout the specification (including the claims) of the disclosure may refer to any direct or indirect means of connection. For example, if a first device is described as being coupled (or connected) to a second device, it should be interpreted that the first device may be directly connected to the second device, or the first device may be indirectly connected to the second device through other devices or a certain connection means. Terms such as "first" and "second" as used throughout the specification (including the claims) of the disclosure are used to name elements or to distinguish between different embodiments or ranges, rather than to limit the upper limit or the lower limit of the number of elements nor to limit the order of elements. In addition, where possible, elements/components/steps using the same reference numerals in the drawings and the embodiments represent the same or similar parts. Related descriptions of elements/components/steps using the same reference numerals or using the same terminologies in different embodiments may be cross-referenced.

Figure 1:
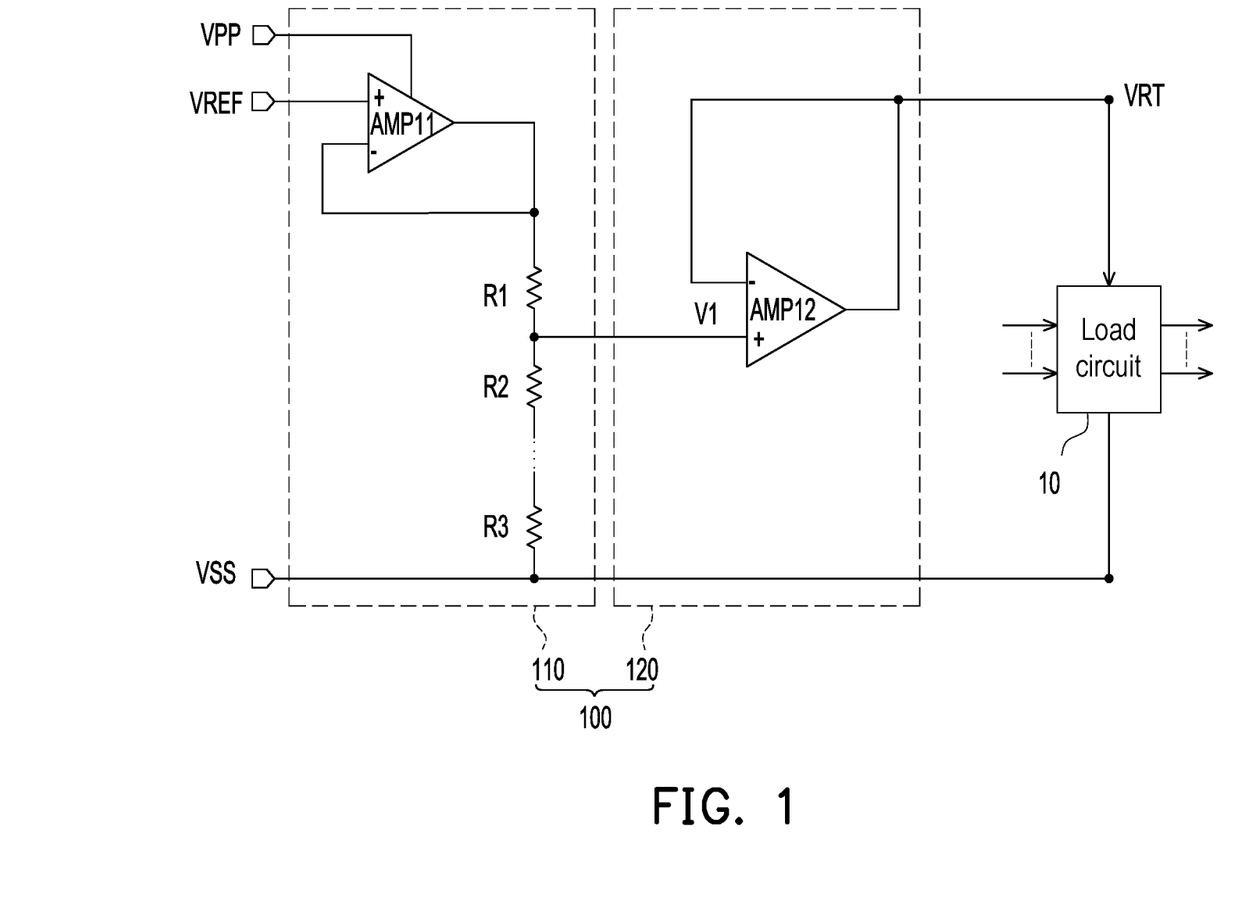
FIG. 1 is a schematic diagram of a circuit block of a power voltage supply device.

FIG. 1 is a schematic diagram of a circuit block of a power voltage supply device 100. The power voltage supply device 100 shown in FIG. 1 may generate a power voltage VRT to a load circuit 10. The load circuit 10 may be any functional circuit. For example, according to the actual design, the load circuit 10 may include a receiver circuit, a transmitter circuit, and/or other functional circuits in a dynamic random access memory (DRAM).

The power voltage supply device 100 includes a voltage generator 110 and a voltage buffer 120. The voltage buffer 120 may include a low-dropout regulator (LDO) and/or other gain circuits. For example, in the embodiment shown in FIG. 1, the voltage buffer 120 includes an operational amplifier AMP12. An inverting input terminal of the operational amplifier AMP12 is coupled to an output terminal of the operational amplifier AMP12. The output terminal of the operational amplifier AMP12 outputs the power voltage VRT to the load circuit 10. A non-inverting input terminal of the operational amplifier AMP12 is coupled to an output terminal of the voltage generator 110 to receive a voltage V1.

In the embodiment shown in FIG. 1, the voltage generator 110 includes an operational amplifier AMP11 and multiple resistors (for example, a resistor R1, a resistor R2, ..., a resistor Rn shown in FIG. 1). A voltage VPP powers the amplifier AMP11. The voltage VPP is a fixed voltage. The level of the voltage VPP may be determined according to the actual design. A non-inverting input terminal of the amplifier AMP11 receives a reference voltage VREF. The reference voltage VREF is a fixed voltage that does not change with temperature and the voltage VPP. For example, the reference voltage VREF may be a band gap voltage or other fixed voltages. An inverting input terminal of the operational amplifier AMP11 is coupled to an output terminal of the operational amplifier AMP11. The output terminal of the operational amplifier AMP11 is coupled to a first terminal of the resistor R1.

The resistors R1 to Rn are connected in series between the output terminal of the operational amplifier AMP11 and a voltage VSS. The voltage VSS is a fixed voltage. The level of the power supply VSS may be determined according to the actual design. For example, voltage VSS may be a ground voltage. A resistor string formed by the resistors R1 to Rn has multiple voltage dividing nodes, and one of the voltage dividing nodes may provide the voltage V1 to the non-inverting input terminal of the operational amplifier AMP12. For example, in the example shown in FIG. 1, the voltage dividing node between the resistor R1 and the resistor R2 provides the voltage V1 to the non-inverting input terminal of the operational amplifier AMP12. The voltage generator 110 may generate the voltage V1 based on the reference voltage VREF. Since the driving capability of the voltage generator 110 is limited, the voltage buffer 120 generates the power voltage VRT corresponding to the voltage V1 to the load circuit 10. Since the source is the reference voltage VREF that does not change with temperature and the voltage VPP, the voltage V1 and the power voltage VRT also do not change with temperature and the voltage VPP. In other words, the power voltage VRT shown in FIG. 1 is a fixed voltage.

At high temperature, thermal noise is generated due to random movement of electrons, which degrades the transmission capability of the load circuit 10. When the power voltage VRT is larger, the receiving/transmission capability of the load circuit 10 is better (and vice versa). If the power voltage VRT shown in FIG. 1 is set to a higher level to improve the transmission capability of the load circuit 10 at high temperature, the higher fixed power voltage VRT at low temperature will increase system power consumption.

Figure 2:
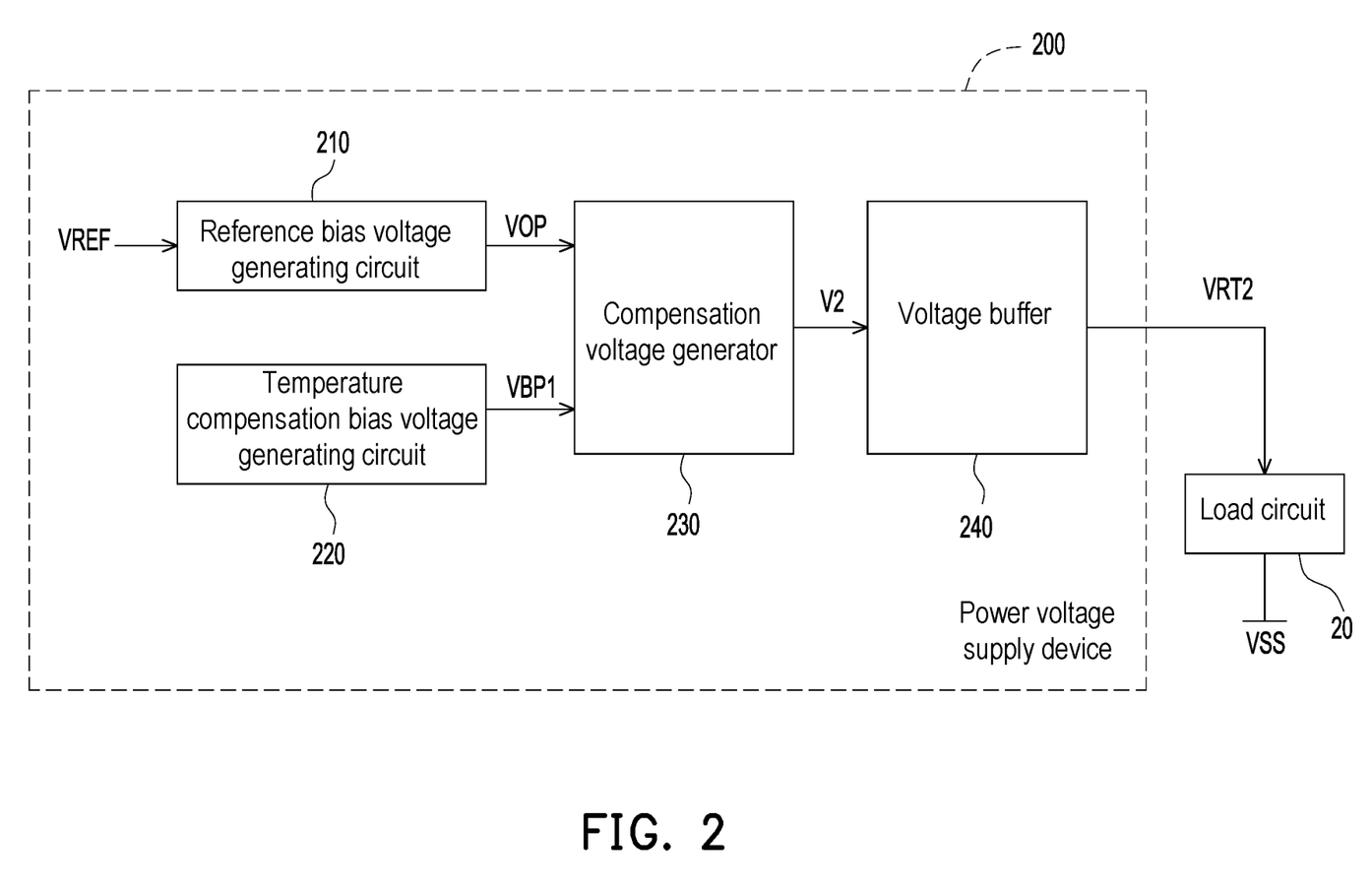
FIG. 2 is a schematic diagram of a circuit block of a power voltage supply device according to an embodiment of the disclosure.

FIG. 2 is a schematic diagram of a circuit block of a power voltage supply device 200 according to an embodiment of the disclosure. The power voltage supply device 200 shown in FIG. 2 may generate a power voltage VRT2 to a load circuit 20. The load circuit 20 shown in FIG. 2 may be analogized with reference to the related description of the load circuit 10 shown in FIG. 1, and details are not repeated here.

The power voltage supply device 200 shown in FIG. 2 includes a reference bias voltage generating circuit 210, a temperature compensation bias voltage generating circuit 220, a compensation voltage generator 230, and a voltage buffer 240. The reference bias voltage generating circuit 210 may generate a reference bias voltage VOP based on a reference voltage VREF. The reference voltage VREF is a fixed voltage that does not change with temperature and a voltage VPP. For the reference voltage VREF shown in FIG. 2, reference may be made to the related description of the reference voltage VREF shown in FIG. 1, so there will be no repetition. Therefore, the reference bias voltage VOP is also a fixed voltage that does not change with temperature and the voltage VPP. The compensation voltage generator 230 is coupled to the reference bias voltage generating circuit 210 to receive the reference bias voltage VOP. The compensation voltage generator 230 may generate a power voltage V2 to the voltage buffer 240 based on the reference bias voltage VOP.

The temperature compensation bias voltage generating circuit 220 may generate a temperature compensation bias voltage VBP1 that changes as temperature rises. The compensation voltage generator 230 is coupled to the temperature compensation bias voltage generating circuit 220 to receive the temperature compensation bias voltage VBP1. The compensation voltage generator 230 selectively boosts the power voltage V2 based on the temperature compensation bias voltage VBP1. For example, when temperature is lower than a certain reference temperature (that is, the adverse effect of the current temperature on the load circuit 20 can be tolerated), the compensation voltage generator 230 may generate the power voltage V2 to the voltage buffer 240 based on the reference bias voltage VOP, while the temperature compensation bias voltage generating circuit 220 may control the compensation voltage generator 230 to not boost the power voltage V2 (for example, to enable the power voltage V2 to be approximately equal to the reference voltage VREF) through the temperature compensation bias voltage VBP1. When temperature is higher than the reference temperature, the temperature compensation bias voltage generating circuit 220 may control the compensation voltage generator 230 through the temperature compensation bias voltage VBP1 to correspondingly boost the power voltage V2 (for example, to enable the power voltage V2 to be greater than the reference voltage VREF).

An input terminal of the voltage buffer 240 is coupled to the compensation voltage generator 230 to receive the power voltage V2. The voltage buffer 240 may generate the power voltage VRT2 corresponding to the power voltage V2 to the load circuit 20. The relationship between the power voltage V2 and the power voltage VRT2 may be determined according to the actual design. For example, in some embodiments, the level of the power voltage VRT2 is approximately equal to the level of the power voltage V2. When temperature is lower than a certain reference temperature (that is, the adverse effect of the current temperature on the load circuit 20 can be tolerated), the power voltage V2 is not dynamically boosted (for example, the power voltage V2 is approximately equal to the reference voltage VREF), so the voltage buffer 240 may generate the lower power voltage VRT2 to the load circuit 20 to reduce system power consumption. When temperature is higher than the reference temperature, the power voltage V2 is dynamically boosted (for example, the power voltage V2 is enabled to be greater than the reference voltage VREF), so the voltage buffer 240 may generate the higher power voltage VRT2 to the load circuit 20 to boost the transmission capability of the load circuit 20.

Figure 3:
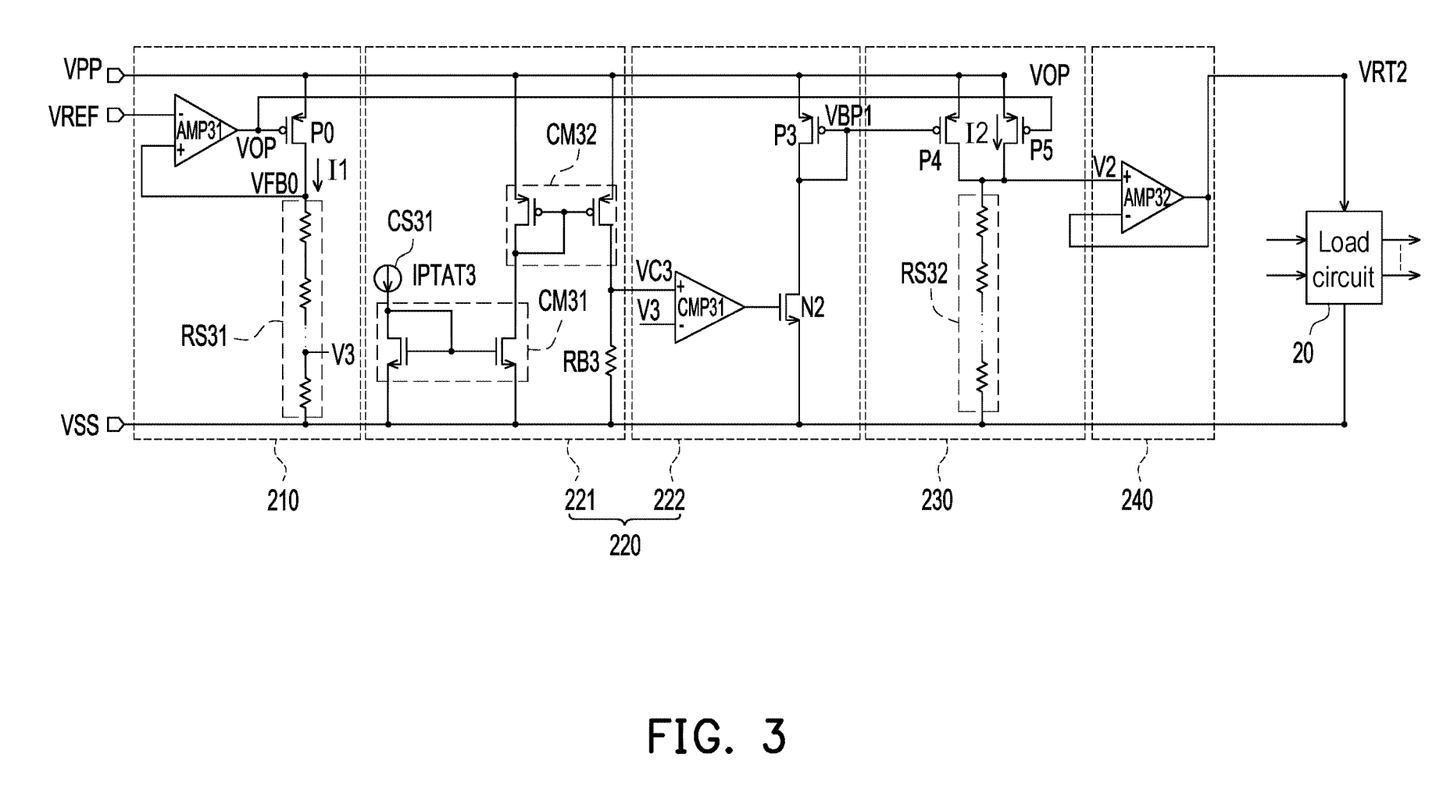
FIG. 3 is a schematic diagram of a circuit block of a reference bias voltage generating circuit, a temperature compensation bias voltage generating circuit, a compensation voltage generator, and a voltage buffer of FIG. 2 according to an embodiment of the disclosure.

FIG. 3 is a schematic diagram of a circuit block of the reference bias voltage generating circuit 210, the temperature compensation bias voltage generating circuit 220, the compensation voltage generator 230, and the voltage buffer 240 of FIG. 2 according to an embodiment of the disclosure. For the reference bias voltage generating circuit 210, the temperature compensation bias voltage generating circuit 220, the compensation voltage generator 230, the voltage buffer 240, and the load circuit 20 shown in FIG. 3, reference may be made to the related description of the reference bias voltage generating circuit 210, the temperature compensation bias voltage generating circuit 220, the compensation voltage generator 230, the voltage buffer 240, and the load circuit 20 shown in FIG. 2.

In the embodiment shown in FIG. 3, the reference bias voltage generating circuit 210 includes an amplifier AMP31, a transistor P0, and a resistor circuit RS31. A first input terminal (for example, an inverting input terminal) of the amplifier AMP31 may receive a reference voltage VREF. The reference voltage VREF is a fixed voltage that does not change with temperature and a voltage VPP. For the reference voltage VREF shown in FIG. 3, reference may be made to the related description of the reference voltage VREF shown in FIG. 1, so there will be no repetition. A control terminal (for example, a gate) of the transistor P0 is coupled to an output terminal of the amplifier AMP31 to receive a reference bias voltage VOP. The output terminal of the amplifier AMP31 also provides the reference bias voltage VOP to the compensation voltage generator 230. A first terminal (for example, a source) of the transistor P0 is coupled to the voltage VPP. A second terminal (for example, a drain) of the transistor P0 is coupled to a second input terminal (for example, a non-inverting input terminal) of the amplifier AMP31 to provide a feedback voltage VFB0. Therefore, the feedback voltage VFB0 is approximately equal to the reference voltage VREF.

A first terminal of the resistor circuit RS31 is coupled to a second terminal of the transistor P0 to receive the feedback voltage VFB0. A second terminal of the resistor circuit RS31 is coupled to a voltage VSS. In the embodiment shown in FIG. 3, the resistor circuit RS31 includes a resistor string. The resistor string has multiple voltage dividing nodes, and one of the voltage dividing nodes may provide a reference voltage V3 to the temperature compensation bias voltage generating circuit 220. Based on which of the voltage dividing nodes is selected to provide the reference voltage V3, the level of the reference voltage V3 may be determined. The level of the reference voltage V3 may be determined according to the actual design. After determining the level of the reference voltage V3, the reference voltage V3 is also a fixed voltage that does not change with temperature and the voltage VPP.

In the embodiment shown in FIG. 3, the temperature compensation bias voltage generating circuit 220 includes a converter circuit 221 and a converter circuit 222. The converter circuit 221 may convert a temperature-dependent current IPTAT3 into a control voltage VC3. Therefore, the control voltage VC3 may change with temperature. An input terminal of the converter circuit 222 is coupled to an output terminal of the converter circuit 221 to receive the control voltage VC3. The converter circuit 222 is also coupled to the reference bias voltage generating circuit 210 to receive the reference voltage V3. The converter circuit 222 may convert the relationship between the control voltage VC3 and the reference voltage V3 into the temperature compensation bias voltage VBP1. The converter circuit 222 may provide the temperature compensation bias voltage VBP1 to the compensation voltage generator 230.

In the embodiment shown in FIG. 3, the converter circuit 221 includes a PTAT (Proportional To Absolute Temperature) current source CS31, a current mirror CM31, a current mirror CM32, and a resistor RB3. The PTAT current source CS31 is used to provide the temperature-dependent current IPTAT3. A master current terminal of the current mirror CM31 is coupled to the PTAT current source CS31 to receive the temperature-dependent current IPTAT3. A master current terminal of the current mirror CM32 is coupled to a slave current terminal of the current mirror CM31. A first terminal of the resistor RB3 is coupled to a slave current terminal of the current mirror CM32 and the input terminal of the converter circuit 222. A voltage at the first terminal of the resistor RB3 is used as the control voltage VC3. A second terminal of the resistor RB3 is coupled to a reference voltage (for example, the voltage VSS).

In the embodiment shown in FIG. 3, the converter circuit 222 includes a comparator CMP31, a transistor N2, and a transistor P3. A first input terminal (for example, an inverting input terminal) of the comparator CMP31 is used to receive the reference voltage V3. A second input terminal (for example, a non-inverting input terminal) of the comparator CMP31 is coupled to the output terminal of the converter circuit 221 to receive the control voltage VC3. A control terminal (for example, a gate) of the transistor N2 is coupled to an output terminal of the comparator CMP31. A first terminal (for example, a source) of the transistor N2 is coupled to the voltage VSS. A first terminal (for example, a source) of the transistor P3 is coupled to the voltage VPP. A second terminal (for example, a drain) of the transistor P3 is coupled to a second terminal (for example, a drain) of the transistor N2. A control terminal (for example, a gate) of the transistor P3 is coupled to a second terminal of the transistor P3. The control terminal of the transistor P3 is coupled to the compensation voltage generator 230 to provide the temperature compensation bias voltage VBP1.

When temperature is lower than a certain reference temperature (that is, the adverse effect of the current temperature on the load circuit 20 can be tolerated), the control voltage VC3 corresponding to the temperature-dependent current IPTAT3 is less than the reference voltage V3, so the comparator CMP31 turns off the transistor N2, thereby turning off the transistor P3. When temperature is higher than the reference temperature, the control voltage VC3 corresponding to the temperature-dependent current IPTAT3 is greater than the reference voltage V3, so the comparator CMP31 turns on the transistor N2, thereby turning on the transistor P3.

In the embodiment shown in FIG. 3, the compensation voltage generator 230 includes a transistor P4, a transistor P5, and a resistor circuit RS32. A control terminal (for example, a gate) of the transistor P5 is coupled to the output terminal of the amplifier AMP31 to receive the reference bias voltage VOP. A first terminal (for example, a source) of the transistor P5 is coupled to the voltage VPP. A second terminal (for example, a drain) of the transistor P5 is coupled to the input terminal of the voltage buffer 240 to provide the power voltage V2. A control terminal (for example, a gate) of the transistor P4 is coupled to the temperature compensation bias voltage generating circuit 220 to receive the temperature compensation bias voltage VBP1. A first terminal (for example, a source) of the transistor P4 is coupled to the voltage VPP. A second terminal (for example, a drain) of the transistor P4 is coupled to the second terminal of the transistor P5. A first terminal of the resistor circuit RS32 is coupled to the second terminal of the transistor P5. A second terminal of the resistor circuit RS32 is coupled to the voltage VSS.

In the embodiment shown in FIG. 3, the voltage buffer 240 includes an amplifier AMP32. A first input terminal (for example, an inverting input terminal) of the amplifier AMP32 is coupled to an output terminal of the amplifier AMP32. The output terminal of the amplifier AMP32 outputs the power voltage VRT2 to the load circuit 20. The load circuit 20 shown in FIG. 3 may be analogized with reference to the related description of the load circuit shown in FIG. 1, and details are not repeated here. A second input terminal (for example, a non-inverting input terminal) of the amplifier AMP32 is coupled to the compensation voltage generator 230 to receive the power voltage V2.

In the embodiment shown in FIG. 3, the resistor circuit RS32 includes a resistor string. The resistance value of the resistor circuit RS32 is approximately equal to the resistance value of the resistor circuit RS31. The aspect ratio of the transistor P5 is approximately equal to the aspect ratio of the transistor P0. Therefore, a current I2 flowing through the transistor P5 is approximately equal to a current I1 of the transistor P0.

When temperature is lower than a certain reference temperature (that is, the adverse effect of the current temperature on the load circuit 20 can be tolerated), the control voltage VC3 corresponding to the temperature-dependent current IPTAT3 is less than the reference voltage V3, so the transistor N2 and the transistor P4 are turned off. At this time, the transistor P4 does not provide compensation current. When the transistor P4 is turned off, the level of the power voltage V2 is approximately equal to the level of the feedback voltage VFB0 (the reference voltage VREF). In other words, the power voltage V2 is not dynamically boosted, so the voltage buffer 240 may generate the lower power voltage VRT2 to the load circuit 20 to reduce system power consumption.

When temperature is higher than the reference temperature, the control voltage VC3 corresponding to the temperature-dependent current IPTAT3 is greater than the reference voltage V3, so the transistor N2 and the transistor P4 are turned on. At this time, the transistor P4 provides compensation current, so that the power voltage V2 is dynamically boosted (for example, the power voltage V2 is enabled to be greater than the reference voltage VREF). Therefore, the voltage buffer 240 may selectively generate the higher power voltage VRT2 to the load circuit 20 to improve the transmission capability of the load circuit 20.

Figure 4:
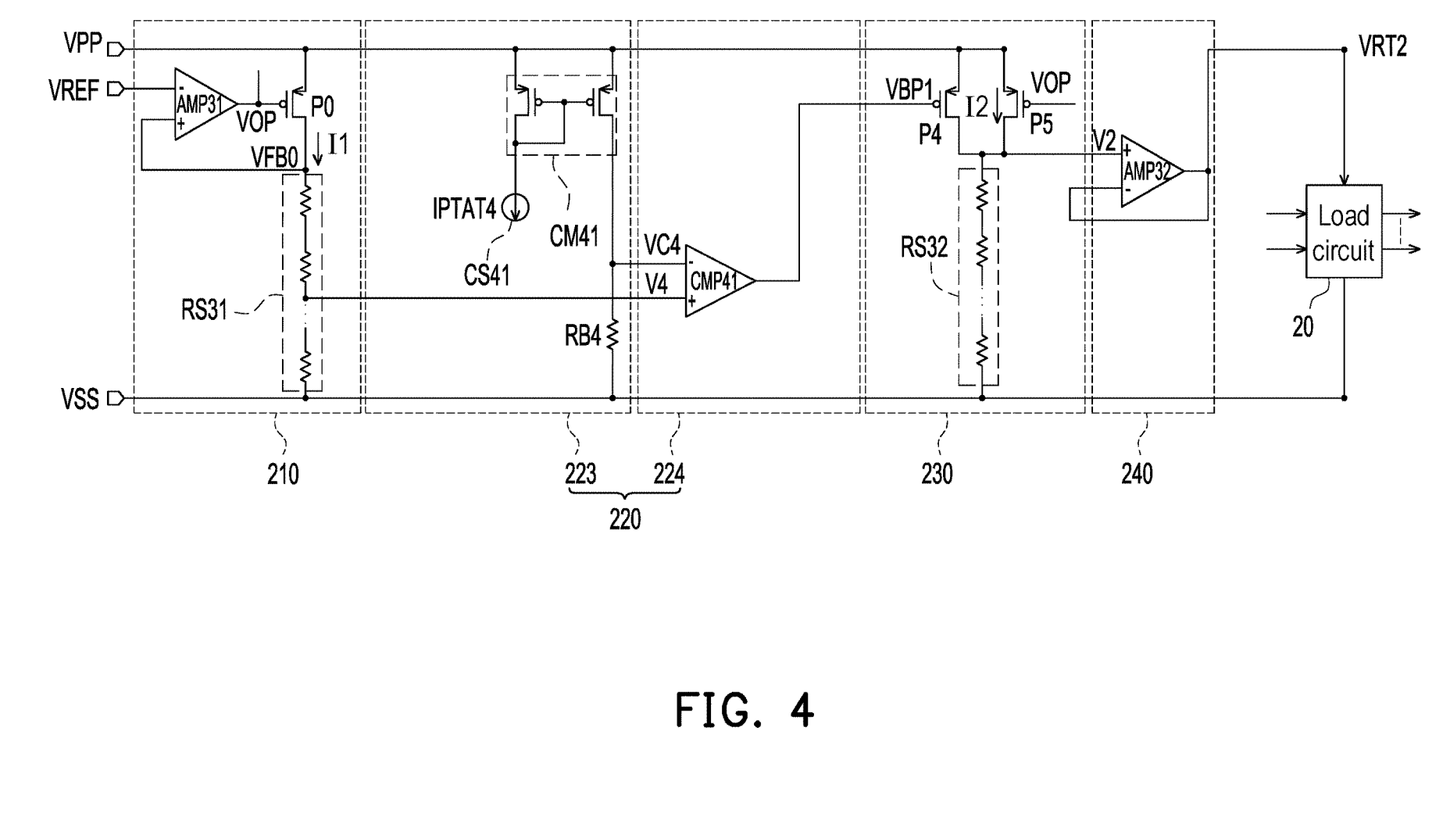
FIG. 4 is a schematic diagram of a circuit block of a reference bias voltage generating circuit, a temperature compensation bias voltage generating circuit, a compensation voltage generator, and a voltage buffer of FIG. 2 according to another embodiment of the disclosure.

FIG. 4 is a schematic diagram of a circuit block of the reference bias voltage generating circuit 210, the temperature compensation bias voltage generating circuit 220, the compensation voltage generator 230, and the voltage buffer 240 of FIG. 2 according to another embodiment of the disclosure. For the reference bias voltage generating circuit 210, the temperature compensation bias voltage generating circuit 220, the compensation voltage generator 230, the voltage buffer 240, and the load circuit 20 shown in FIG. 4, reference may be made to the related description of the reference bias voltage generating circuit 210, the temperature compensation bias voltage generating circuit 220, the compensation voltage generator 230, the voltage buffer 240, and the load circuit 20 shown in FIG. 2. For the reference bias voltage generating circuit 210, the compensation voltage generator 230, and the voltage buffer 240 shown in FIG. 4, reference may be made to the related description of the reference bias voltage generating circuit 210, the compensation voltage generator 230, and the voltage buffer 240 shown in FIG. 3, so there will be no repetition.

In the embodiment shown in FIG. 4, the temperature compensation bias voltage generating circuit 220 includes a converter circuit 223 and a converter circuit 224. The converter circuit 223 may convert a temperature-dependent current IPTAT4 into a control voltage VC4. Therefore, the control voltage VC4 may change with temperature. An input terminal of the converter circuit 224 is coupled to an output terminal of the converter circuit 223 to receive the control voltage VC4. The converter circuit 224 is also coupled to the reference bias voltage generating circuit 210 to receive the reference voltage V3. The converter circuit 224 may convert the relationship between the control voltage VC4 and the reference voltage V3 into the temperature compensation bias voltage VBP1. The converter circuit 224 may provide the temperature compensation bias voltage VBP1 to the compensation voltage generator 230.

In the embodiment shown in FIG. 4, the converter circuit 223 includes a PTAT (Proportional To Absolute Temperature) current source CS41, a current mirror CM41, and a resistor RB4. The PTAT current source CS41 is used to draw the temperature-dependent current IPTAT4. A master current terminal of the current mirror CM41 is coupled to the PTAT current source CS41 to provide the temperature-dependent current IPTAT4. A first terminal of the resistor RB4 is coupled to a slave current terminal of the current mirror CM41 and the input terminal of the converter circuit 224. A second terminal of the resistor RB4 is coupled to a reference voltage (for example, the voltage VSS). A voltage at the first terminal of the resistor RB4 is used as the control voltage VC4.

In the embodiment shown in FIG. 4, the converter circuit 224 includes a comparator CMP41. A first input terminal (for example, an inverting input terminal) of the comparator CMP41 is coupled to the output terminal of the converter circuit 223 to receive the control voltage VC4. A second input terminal (for example, a non-inverting input terminal) of the comparator CMP41 is used to receive the reference voltage V3. An output terminal of the comparator CMP41 is coupled to the compensation voltage generator 230 to provide the temperature compensation bias voltage VBP1.

When temperature is lower than a certain reference temperature (that is, the adverse effect of the current temperature on the load circuit 20 can be tolerated), the control voltage VC4 corresponding to the temperature-dependent current IPTAT4 is less than the reference voltage V3, so the comparator CMP41 turns off the transistor P4. At this time, the transistor P4 does not provide compensation current. When the transistor P4 is turned off, the level of the power voltage V2 is approximately equal to the level of the feedback voltage VFB0 (the reference voltage VREF). In other words, the power voltage V2 is not dynamically boosted, so the voltage buffer 240 may generate the lower power voltage VRT2 to the load circuit 20 to reduce system power consumption.

When temperature is higher than the reference temperature, the control voltage VC4 corresponding to the temperature-dependent current IPTAT4 is greater than the reference voltage V3, so the comparator CMP41 turns on the transistor P4. At this time, the transistor P4 provides compensation current, so that the power voltage V2 is dynamically boosted (for example, the power voltage V2 is enabled to be greater than the reference voltage VREF). Therefore, the voltage buffer 240 may selectively generate the higher power voltage VRT2 to the load circuit 20 to improve the transmission capability of the load circuit 20.

In summary, the power voltage supply device 200 of the above embodiments may generate the reference bias voltage VOP that ideally does not change with temperature, and may generate the temperature compensation bias voltage VBP1 that changes as temperature rises. The power voltage supply device 200 may generate the power voltage VRT2 suitable for the load circuit 20 based on the reference bias voltage VOP. Based on the temperature compensation bias voltage VBP1, the power voltage supply device 200 may selectively boost the power voltage VRT2 of the load circuit 20 as temperature rises. Therefore, the power voltage supply device 200 can maintain the transmission capability of the load circuit 20 (the functional circuit) as much as possible at high temperature.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A power voltage supply device, comprising:
   a reference bias voltage generating circuit, configured to generate a reference bias voltage;
   a temperature compensation bias voltage generating circuit, configured to generate a temperature compensation bias voltage, wherein the temperature compensation bias voltage changes as a temperature rises;
   a compensation voltage generator, coupled to the reference bias voltage generating circuit and the temperature compensation bias voltage generating circuit to receive the reference bias voltage and the temperature compensation bias voltage, and configured to generate a first power voltage based on the reference bias voltage, and selectively boost the first power voltage based on the temperature compensation bias voltage; and
   a voltage buffer, having an input terminal coupled to the compensation voltage generator to receive the first power voltage, and configured to generate a second power voltage corresponding to the first power voltage to a load circuit.

2. The power voltage supply device according to claim 1, wherein the load circuit comprises a receiver circuit or a transmitter circuit of a dynamic random access memory.

3. The power voltage supply device according to claim 1, wherein a level of the second power voltage is approximately equal to a level of the first power voltage.

4. The power voltage supply device according to claim 1, wherein the reference bias voltage generating circuit generates the reference bias voltage based on a reference voltage,
   the temperature compensation bias voltage controls the compensation voltage generator to not boost the first power voltage when the temperature is lower than a reference temperature, so that the first power voltage is approximately equal to the reference voltage; and
   the temperature compensation bias voltage controls the compensation voltage generator to correspondingly boost the first power voltage when the temperature is higher than the reference temperature, so that the first power voltage is greater than the reference voltage.

5. The power voltage supply device according to claim 1, wherein the temperature compensation bias voltage generating circuit comprises:
   a first converter circuit, configured to convert a temperature-dependent current into a control voltage, wherein the control voltage changes as the temperature changes; and
   a second converter circuit, having an input terminal coupled to an output terminal of the first converter circuit to receive the control voltage, and configured to convert a relationship between the control voltage and a first reference voltage to the temperature compensation bias voltage.

6. The power voltage supply device according to claim 5, wherein the second converter circuit is coupled to the reference bias voltage generating circuit to receive the first reference voltage.

7. The power voltage supply device according to claim 5, wherein the first converter circuit comprises:
   a Proportion To Absolute Temperature (PTAT) current source, configured to provide the temperature-dependent current;
   a first current mirror, having a master current terminal coupled to the PTAT current source to receive the temperature-dependent current;
   a second current mirror, having a master current terminal coupled to a slave current terminal of the first current mirror; and
   a resistor, having a first terminal coupled to a slave current terminal of the second current mirror and the input terminal of the second converter circuit, wherein a second terminal of the resistor is coupled to a second reference voltage, and a voltage at the first terminal of the resistor is used as the control voltage.

8. The power voltage supply device according to claim 5, wherein the second converter circuit comprises:
   a comparator, having a first input terminal for receiving the first reference voltage, wherein a second input terminal of the comparator is coupled to the output terminal of the first converter circuit to receive the control voltage;
   a first transistor, having a control terminal coupled to an output terminal of the comparator, wherein a first terminal of the first transistor is coupled to a first voltage; and
   a second transistor, having a first terminal coupled to a second voltage, wherein a second terminal of the second transistor is coupled to a second terminal of the first transistor, a control terminal of the second transistor is coupled to the second terminal of the second transistor, and the control terminal of the second transistor is coupled to the compensation voltage generator to provide the temperature compensation bias voltage.

9. The power voltage supply device according to claim 5, wherein the first converter circuit comprises:
   a PTAT current source, configured to draw the temperature-dependent current;
   a current mirror, having a master current terminal coupled to the PTAT current source to provide the temperature-dependent current; and
   a resistor, having a first terminal coupled to a slave current terminal of the current mirror and the input terminal of the second converter circuit, wherein a second terminal of the resistor is coupled to a second reference voltage, and a voltage at the first terminal of the resistor is used as the control voltage.

10. The power voltage supply device according to claim 5, wherein the second converter circuit comprises:
    a comparator, having a first input terminal coupled to the output terminal of the first converter circuit to receive the control voltage, wherein a second input terminal of the comparator is configured to receive the first reference voltage, and an output terminal of the comparator is coupled to the compensation voltage generator to provide the temperature compensation bias voltage.

11. The power voltage supply device according to claim 1, wherein the reference bias voltage generating circuit comprises:
   an amplifier, having a first input terminal for receiving a reference voltage;
   a first transistor, having a control terminal coupled to an output terminal of the amplifier, wherein a first terminal of the first transistor is coupled to a first voltage, and a second terminal of the first transistor is coupled to a second input terminal of the amplifier; and
   a first resistor circuit, having a first terminal coupled to the second terminal of the first transistor, wherein a second terminal of the first resistor circuit is coupled to a second voltage.

12. The power voltage supply device according to claim 11, wherein the compensation voltage generator comprises:
   a second transistor, having a control terminal coupled to the output terminal of the amplifier to receive the reference bias voltage, wherein a first terminal of the second transistor is coupled to the first voltage, and a second terminal of the second transistor is coupled to the input terminal of the voltage buffer;
   a third transistor, having a control terminal coupled to the temperature compensation bias voltage generating circuit to receive the temperature compensation bias voltage, wherein a first terminal of the third transistor is coupled to the first voltage, and a second terminal of the third transistor is coupled to the second terminal of the second transistor; and
   a second resistor circuit, having a first terminal coupled to the second terminal of the second transistor, wherein a second terminal of the second resistor circuit is coupled to the second voltage.

13. The power voltage supply device according to claim 12, wherein an aspect ratio of the first transistor is approximately equal to an aspect ratio of the second transistor.

14. The power voltage supply device according to claim 12, wherein a resistance value of the first resistor circuit is approximately equal to a resistance value of the second resistor circuit.

15. The power voltage supply device according to claim 1, wherein the voltage buffer comprises:
   an amplifier, having a first input terminal coupled to an output terminal of the amplifier, wherein the output terminal of the amplifier outputs the second power voltage to the load circuit, and a second input terminal of the amplifier is coupled to the compensation voltage generator to receive the first power voltage.

* * * * *